United States Patent
Smith (10) Patent No.: US 9,906,072 B2
(45) Date of Patent: Feb. 27, 2018

(54) SYSTEMS AND METHODS FOR MATCHING AN END OF DISCHARGE FOR MULTIPLE BATTERIES

(71) Applicant: EMERSON NETWORK POWER, ENERGY SYSTEMS, NORTH AMERICA, INC., Warrenville, IL (US)

(72) Inventor: Michael Francis Smith, Columbia Station, OH (US)

(73) Assignee: VERTIV ENERGY SYSTEMS, INC., Lombard, IL (US)

( * ) Notice: Subject to any disclaimer, the term of this patent is extended or adjusted under 35 U.S.C. 154(b) by 218 days.

(21) Appl. No.: 14/814,952

(22) Filed: Jul. 31, 2015

(65) Prior Publication Data
US 2016/0036270 A1 Feb. 4, 2016

Related U.S. Application Data

(60) Provisional application No. 62/032,964, filed on Aug. 4, 2014.

(51) Int. Cl.
*H02J 7/00* (2006.01)
*H02J 9/06* (2006.01)
*G01R 31/36* (2006.01)

(52) U.S. Cl.
CPC .............. *H02J 9/061* (2013.01); *G01R 31/36* (2013.01)

(58) Field of Classification Search
CPC .............. Y02T 10/7005; Y02T 10/7044; H02J 7/0054; B60L 2240/547
See application file for complete search history.

(56) References Cited

U.S. PATENT DOCUMENTS

| | | | |
|---|---|---|---|
| 5,153,496 A | 10/1992 | LaForge | |
| 5,614,331 A | 3/1997 | Takeuchi et al. | |
| 5,666,006 A | 9/1997 | Townsley et al. | |
| 5,691,621 A | 11/1997 | Phuoc et al. | |
| 6,377,027 B2 | 4/2002 | Takemoto | |
| 6,693,431 B1 | 2/2004 | Leyde et al. | |
| 7,494,729 B2 | 2/2009 | Odaohhara | |

(Continued)

FOREIGN PATENT DOCUMENTS

| | | |
|---|---|---|
| CN | 100559680 | 11/2009 |
| CN | 101667737 | 3/2010 |

(Continued)

*Primary Examiner* — Sibin Chen
(74) *Attorney, Agent, or Firm* — Harness, Dickey & Pierce, P.L.C.

(57) ABSTRACT

A system includes a first power converter, a second power converter, a first battery having a time to end of discharge (EOD) and coupled to output a current to the first converter, a second battery having a time to EOD and coupled to output a current to the second converter, and a control circuit coupled to the first converter and the second converter. The control circuit is configured to monitor the times to EOD of the first battery and the second battery, and in response to the times to EOD of the first battery and the second battery not being substantially equal, control the first converter to adjust the current drawn from the first battery to change a rate of decrease of the time to EOD of the first battery. Other example systems and methods for substantially matching a time to EOD of a plurality of batteries are also disclosed.

20 Claims, 6 Drawing Sheets

(56) References Cited

U.S. PATENT DOCUMENTS

| | | |
|---|---|---|
| 7,609,031 B2 | 10/2009 | Benckenstein et al. |
| 7,852,046 B2 | 12/2010 | Krah et al. |
| 8,332,342 B1 | 12/2012 | Saha et al. |
| 8,541,905 B2 | 9/2013 | Brabec |
| 8,593,015 B2 | 11/2013 | Gottlieb et al. |
| 8,614,563 B2 | 12/2013 | Baughman |
| 8,648,570 B2 | 2/2014 | Lim et al. |
| 2005/0288878 A1 | 12/2005 | Ng |
| 2008/0036419 A1* | 2/2008 | Cook ............... H02J 7/0031 320/104 |
| 2011/0078092 A1 | 3/2011 | Kim et al. |
| 2011/0267007 A1* | 11/2011 | Chen ............... H01M 10/441 320/126 |
| 2012/0319486 A1 | 12/2012 | Polasek |
| 2013/0057222 A1 | 3/2013 | Kim |
| 2013/0147431 A1* | 6/2013 | Lim ............... H02J 7/022 320/109 |
| 2013/0169234 A1 | 7/2013 | Chuah et al. |
| 2014/0183948 A1 | 7/2014 | Hulbert et al. |
| 2014/0232350 A1* | 8/2014 | Chan ............... G06F 1/263 320/134 |

FOREIGN PATENT DOCUMENTS

| | | |
|---|---|---|
| CN | 202435090 | 9/2012 |
| EP | 2491612 | 8/2012 |
| IN | 201200988 | 10/2013 |
| JP | 2006099292 | 4/2006 |
| JP | 2010004667 | 1/2010 |
| JP | 2011061955 | 3/2011 |
| JP | 2012209994 | 10/2012 |
| JP | 2013005677 | 1/2013 |
| KR | 101058351 | 8/2011 |
| KR | 101165593 | 7/2012 |
| WO | 2013147412 | 10/2013 |

\* cited by examiner

SYSTEMS AND METHODS FOR MATCHING AN END OF DISCHARGE FOR MULTIPLE BATTERIES

CROSS-REFERENCE TO RELATED APPLICATION

This application claims the benefit of U.S. Provisional Application No. 62/032,964 filed Aug. 4, 2014.

FIELD

The present disclosure relates to systems and methods for matching an end of discharge for multiple batteries.

BACKGROUND

This section provides background information related to the present disclosure which is not necessarily prior art.

Power systems generally include a primary power source and a backup power source for providing backup power to a load when the primary power source is unable to satisfy load requirements due to, for example, a loss of input power, malfunction, etc. Commonly, the backup power source includes one or more batteries. In such cases, the batteries power the load until they are unable to do so or until the primary power source is able to provide adequate power to the load. Typically, the batteries provide equal currents to the load.

SUMMARY

This section provides a general summary of the disclosure, and is not a comprehensive disclosure of its full scope or all of its features.

According to one aspect of the present disclosure, a power system includes a first power converter and a second power converter, a first battery having a time to end of discharge (EOD) and coupled to output a current to the first power converter, a second battery having a time to EOD and coupled to output a current to the second power converter, and a control circuit coupled to the first power converter and the second power converter. The control circuit is configured to monitor the time to EOD of the first battery and the time to EOD of the second battery, and in response to the time to EOD of the first battery and the time to EOD of the second battery not being substantially equal, control the first power converter to adjust the current drawn from the first battery to change a rate of decrease of the time to EOD of the first battery.

According to another aspect of the present disclosure, a method for substantially matching a time to EOD of a plurality of batteries is disclosed. The method includes determining a time to EOD of a first battery of the plurality of batteries coupled to provide a current to a first power converter, determining a time of EOD of a second battery of the plurality of batteries coupled to provide a current to a second power converter, and in response to the time to EOD of the first battery and the time to EOD of the second battery not being substantially equal, controlling the first power converter to adjust the current drawn from the first battery to change a rate of decrease of the time to EOD of the first battery.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
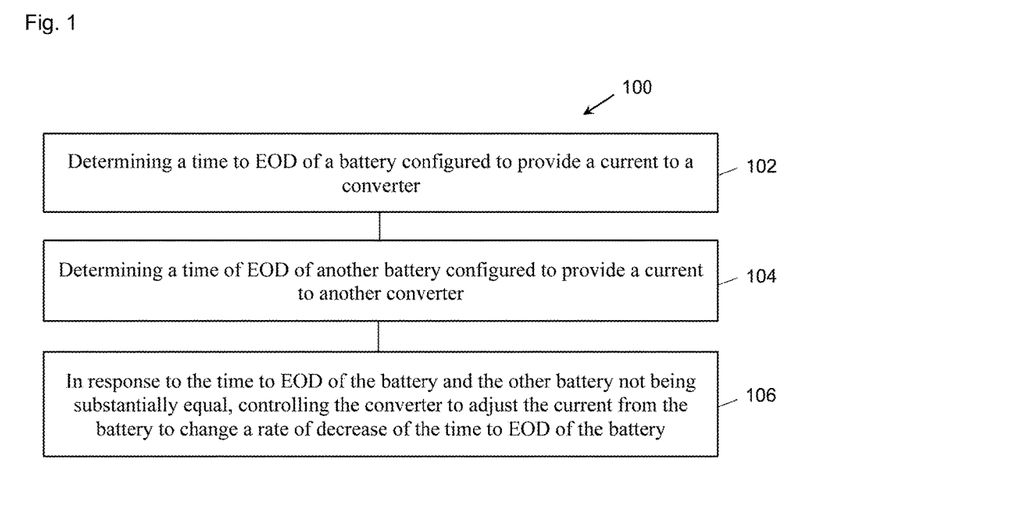
FIG. 1 is a flow diagram of a method for substantially matching a time to EOD of a plurality of batteries according to one example embodiment of the present disclosure.

A method of substantially matching a time to EOD of a plurality of batteries according to one example embodiment of the present disclosure is illustrated in FIG. 1 and indicated generally by reference number 100. As shown in FIG. 1, the method 100 includes determining a time to EOD of a battery of the plurality of batteries coupled to provide a current to a power converter (block 102), determining a time of EOD of another battery of the plurality of batteries coupled to provide a current to another power converter (block 104) and, in response to the time to EOD of the battery and the time to EOD of the other battery not being substantially equal, controlling the power converter to adjust the current drawn from one of the batteries to change a rate of decrease of the time to EOD of that battery (block 106).

By changing the decrease rate of the time to EOD of at least one of the batteries, the time to EOD of that battery may decrease at a faster rate or a slower rate relative to, for example, the other battery. As such, the time to EOD of this battery may become substantially equal to the other battery after a period of time. Once each battery has a substantially equal time to EOD, each power converter can be operated in the same way (or as necessary) so both batteries become depleted at approximately the same time (and subsequently recharged, replaced, etc.). As a result, the holdup time of a power system including the batteries may be increased.

For example, a power system may include a primary power source (e.g., one or more rectifiers, etc.) for powering one or more loads, and two or more batteries to sustain the loads if the primary power source is unable to do so due to a loss of input power, malfunction, etc. If the time to EOD of each battery is not substantially equal and the batteries are sharing the loads equally, one of the batteries may reach its EOD before the other battery. For example, the time to EOD of one battery may be X and the time to EOD of the other battery may be $\frac{3}{4}*X$. Thus, the battery having the time to EOD of $\frac{3}{4}*X$ would reach its EOD (e.g., no remaining available energy) sooner than the other battery having the time to EOD of X if the loads are shared equally.

In some cases, the battery with remaining charge may have enough capacity to provide adequate power to the load(s) (e.g., a desired current at peak power) until the primary power source is able to do so. In other cases, however, the remaining battery may have insufficient capacity to provide adequate power to the load(s). Therefore, although the remaining battery may have available energy, the system may shut down if the peak power required by the load(s) exceeds the power available from the remaining battery in the system.

If the current from one or more of the batteries is controlled as explained herein, the time to EOD of each battery may become substantially equal over time. For example, one or both power converters may be controlled such that the battery current drawn from the battery having the time to EOD of X is increased and/or the battery current drawn from the battery having the time to EOD of $\frac{3}{4}*X$ is decreased. This change in current drawn may cause a change in the rate of decrease of the time to EOD of one or both batteries. Then, the times to EOD may become substantially equal and thus each battery may reach its respective EOD at substantially the same time if the loads are shared equally (assuming the same rate of discharge for each battery). As a result, the batteries may be able to provide the required power to the loads for a longer period of time as compared to, for example, batteries not having the same times to EOD.

The time to EOD of a battery may be determined by dividing the state of charge (SOC) of the battery by a rate of discharge (ROD) of the battery (i.e., EOD=SOC/ROD). The ROD may be dependent on numerous factors including, for example, load demands, the health of the battery, the number of charge/discharge cycles of the battery, the environment around the battery, etc. As such, the ROD of two batteries in a system may be different because each particular battery's ROD may be dependent on particular parameters unique to that battery. Thus, although the SOC of each battery may be substantially equal, the time to EOD of each battery may be different. Therefore, when it is desired to have the batteries become discharged at approximately the same time, adjusting battery current based on the time to EOD of each battery may be more dependable, accurate, etc. than matching the SOC of the batteries, etc.

As mentioned above, controlling one of the power converters to adjust the current drawn from its respective battery may include controlling the converter to increase or decrease the current drawn from this battery. For example, the power converter may initially be controlled to regulate its output voltage to a voltage setpoint. The voltage setpoint may be 12 VDC, 48 VDC, etc. If it is desired to adjust the current drawn from the battery, the voltage setpoint may be adjusted (e.g., reduced, etc.). For example, the voltage setpoint may be decreased slightly from 12 VDC to 11.999 VDC, increased slightly from 48 VDC to 48.001 VDC, etc. In other examples, the voltage setpoint adjustments can be more substantial if desired.

This change in the voltage setpoint causes the output current of the power converter to adjust. As the output current changes, the current drawn from the battery changes accordingly and thus the rate of decrease of the time to EOD of the battery changes. Thus, the power converter's output voltage may be regulated near the original voltage setpoint (e.g., 12 VDC, 48 VDC, etc.) while controlling the battery current and thus the rate of decrease of the time to EOD of the battery. As further explained below, this change in the voltage setpoint may be accomplished by adjusting a control signal (e.g., a PWM signal having an adjustable duty cycle) provided to a power switch in the converter 102 or in another suitable manner.

In other embodiments, one or both of the converters' input current may be regulated at a particular level to adjust the amount of current drawn from the batteries.

In some examples, control of one power converter may be adjusted such that current drawn from its battery is increased as explained above. For example, the current drawn from one battery may be increased to its maximum current or another suitable amount of current. In such examples, the decrease rate of the time to EOD of the battery coupled to this converter would increase relative to, for example, the decrease rate of the time to EOD of the other battery.

Alternatively, control of one of the converters may be adjusted such that current drawn from its battery is decreased as explained above. In this case, the decrease rate of the time to EOD of the battery coupled to this converter would reduce relative to, for example, the other battery.

When current drawn from one battery is adjusted as explained above, current drawn from the other battery may also be adjusted in a controlled manner. For example, if one converter is controlled so that current drawn from a battery coupled to this converter increases to the battery's maximum current or another suitable amount of current, the other converter may be controlled to decrease current drawn from its battery. In such examples, the current drawn from the other battery may be decreased to provide the remaining portion of the required load current if load sharing is desired.

In other embodiments, the outputs of the power converters may be coupled in parallel and employ load sharing. Thus, if control of one converter is adjusted to increase its output current (as explained above), the output current of the other converter will decrease automatically. This causes the current drawn from each battery to adjust accordingly.

In some embodiments, one or both converters may be controlled to adjust the current drawn from its respective battery until the time to EOD of each battery is substantially equal. For example, the current drawn from one battery may be adjusted to change the rate of decrease of the time to EOD of that battery until the time to EOD of the battery is substantially equal to the time to EOD of the other battery. At such time, both converters can be controlled in a similar manner (assuming the ROD of each battery is the same) or differently if desired.

Additionally and/or alternatively, the current drawn from each battery may become substantially equal in response to the times to EOD of the batteries being substantially equal. For example, one or both converters may be controlled so that the current drawn from each battery is substantially equal (e.g., sharing the load equally) assuming the ROD of each battery is the same as explained above.

Additionally, the batteries may provide backup power to the load through load sharing (e.g., balanced load sharing or unbalanced load sharing as explained above) until it is determined that the times to EOD of the batteries are not substantially equal. At such time, control of one or both converters may be adjusted to change current drawn from one or both batteries as explained above. For example, the batteries may initially share the load equally. Once it is determined the times to EOD of the batteries are not substantially equal, the power converters may be controlled to adjust the current (as explained above) so that the load is not shared equally (e.g., unbalanced load sharing). The batteries may then return to sharing the load equally in response to determining the times to EOD of the batteries are substantially equal. This process may repeat as necessary.

The example methods disclosed herein may be implemented by one or more control circuits. For example, FIGS. 2-9 illustrate various example embodiments of systems including one or more control circuits configured to implement various methods including, for example, the methods disclosed herein. It should be understood, however, that the teachings of this disclosure are not limited to the particular examples shown in FIGS. 2-9, and can be applied to a wide variety of other systems.

Figure 2:
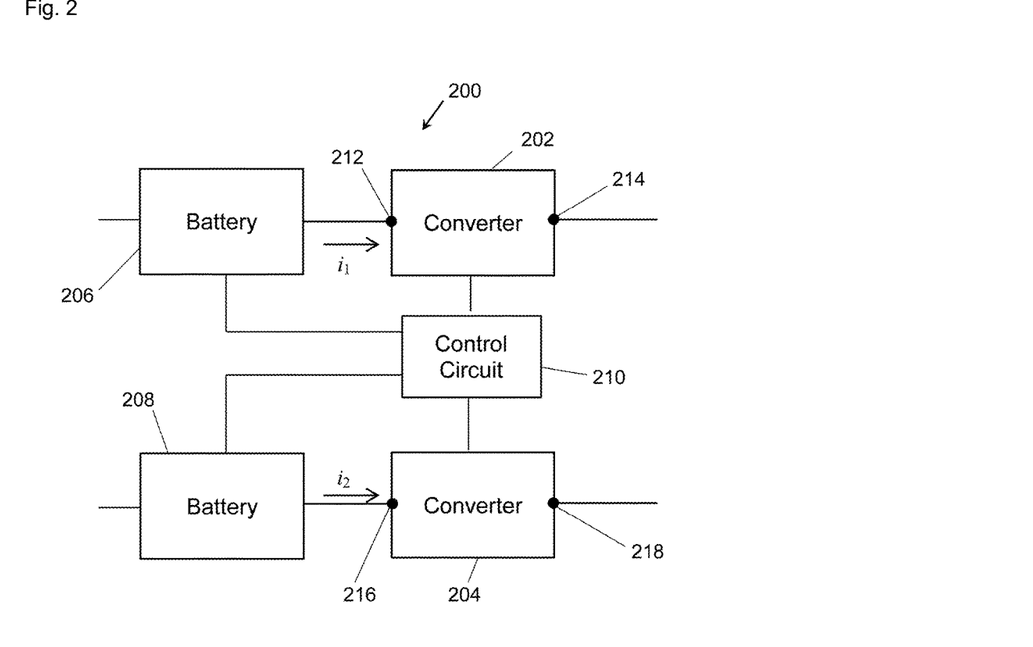
FIG. 2 is a block diagram of a system including two batteries, two converters, and a control circuit for controlling current drawn from the batteries according to another example embodiment.

For example, FIG. 2 illustrates a power system 200 including power converters 202, 204, batteries 206, 208, and a control circuit 210 coupled to the converters 202, 204 and the batteries 206, 208. Each battery 206, 208 outputs a current i1, i2 to the converter 202, 204, respectively, and includes a time to EOD. The control circuit 210 monitors the time to EOD of the battery 206 and the time to EOD of the battery 208, and in response to the times to EOD of the battery 206 and the battery 208 not being substantially equal, controls the power converter 202 to adjust the current drawn from the battery 206 to change a rate of decrease of the time to EOD of the battery 206 as explained above.

The times to EOD of the batteries 206, 208 are based on the SOC and the ROD of each respective battery 206, 208. As such, the control circuit 210 may monitor the time to EOD of each battery 206, 208 by monitoring one or more parameters of each battery 206, 208. For example, the system 200 may include one or more components to sense currents (e.g., the current i1 drawn from the battery 206, the current i2 drawn from the battery 208, etc.), voltages (e.g., an output voltage of the battery 206, an output voltage of the battery 208, etc.), and/or any other suitable parameter of the batteries 206, 208.

In other embodiments, the one or more parameters may include the age of each battery 206, 208, the number of charge cycles of each battery 206, 208, etc. In such examples, the age, the number of charge cycles, etc. of each battery 206, 208 may be stored in memory and modified as appropriate. As such, the control circuit 210 may utilize stored parameters, sensed parameters, etc. to determine the SOC and the rate of discharge of each battery 206, 208 and to monitor the time to EOD of each battery 206, 208.

The control circuit 210 may control one or both converters 202, 204 to adjust (e.g., increase and/or decrease) the current i1, i2 drawn from one or both batteries 206, 208 as explained above. For example, the control circuit 210 may control the converter 202 to adjust the current i1 from the battery 206 to a maximum current of the battery 206, adjust the current i1 from the battery 206 to a level less than the maximum current of the battery 206 but higher than the current i2 of the battery 208, adjust the current i1 to a level less than the current i2 of the battery 208, etc. regardless of whether the current i2 is adjusted. The control circuit 210 may also control the converter 204 to adjust the current i2 from the battery 208 in a similar manner to equalize the times to EOD of the batteries overtime.

The control circuit 210 may control one or both converters 202, 204 to adjust the current i1, i2 drawn from the batteries 206, 208 until the time to EOD of each battery 206, 208 is substantially equal, control one or both converters 202, 204 so that the current i1 drawn from the battery 206 is substantially equal to the current i2 drawn from the battery 208 in response to the time to EOD of each battery 206, 208 being substantially equal, etc. As such, the batteries 206, 208 may provide equal current (e.g., balanced load sharing), provide unequal current (e.g., unbalanced load sharing), etc. depending on the time to EOD of the batteries 206, 208.

As shown in FIG. 2, each converter 202, 204 includes an input terminal 212, 216 and an output terminal 214, 218, respectively. The battery 206 is coupled to the input terminal 212 of the converter 202 and the battery 208 is coupled to the input terminal 216 of the converter 204. Although not shown in FIG. 2, the output terminals 214, 218 may be coupled to the same or different load(s).

Figure 3:
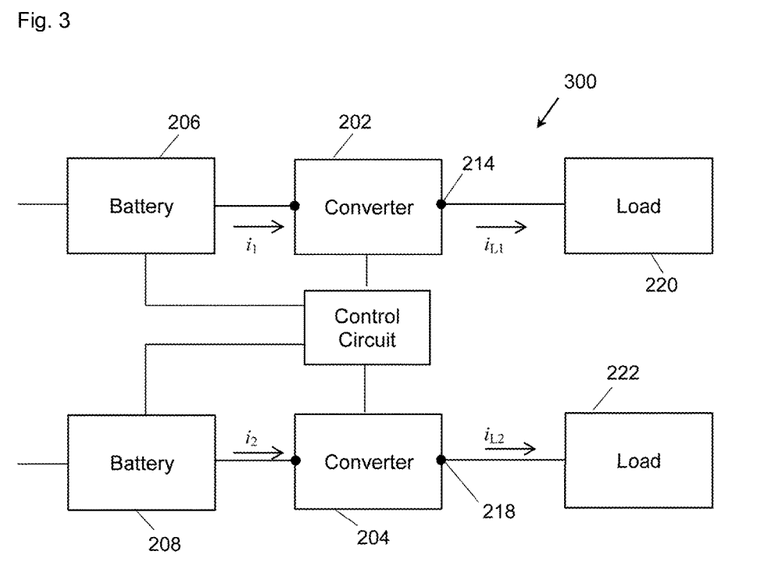
FIG. 3 is a block diagram illustrating the converters of FIG. 2 coupled to different loads.

For example, FIG. 3 illustrates a power system 300 with the output terminal 214 of the power converter 202 coupled to a load 220 and the output terminal 218 of the power converter 204 coupled to another load 222. As such, the converter 202 provides a current iL1 to the load 220 and the converter 204 provides a current iL2 to the load 222. As explained above, the converters 202, 204 may be controlled to ensure the time to EOD of each battery 206, 208 is substantially equal.

Figure 4:
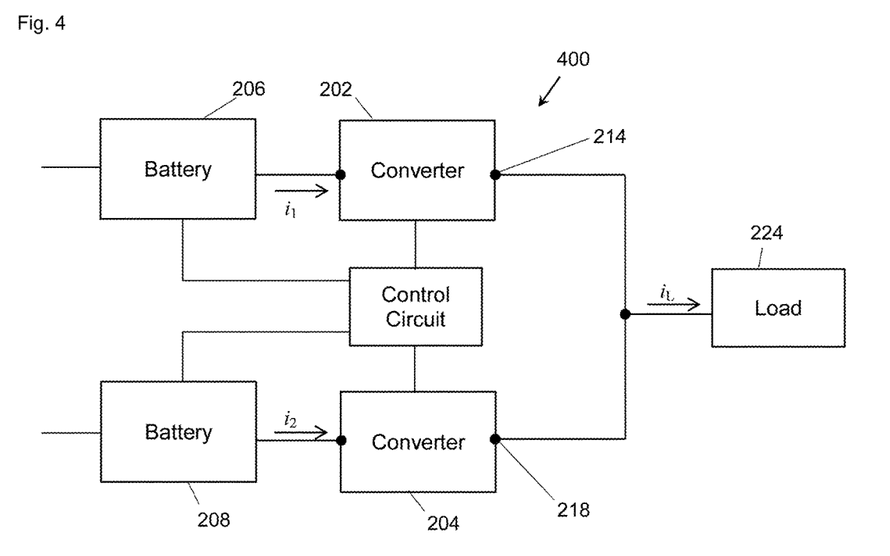
FIG. 4 is a block diagram illustrating the converters of FIG. 2 coupled to same load.

FIG. 4 illustrates a power system 400 including one load 224 coupled to each output terminal 214, 218. As such, the outputs of the power converters 202, 204 of FIG. 4 are coupled in parallel. As a result, when the current drawn from one battery (e.g., the battery 206) is adjusted, current drawn from the other battery (e.g., the battery 208) automatically adjusts as explained above. For example, control of the converter 202 may be adjusted such that its output current increases to force the current i1 drawn from battery 206 to increase to its maximum current. This forces the output current of the converter 204 to decrease to provide the remaining portion of the load current iL. As a result, the current i2 drawn from the battery 208 is forced to decrease as well.

Figure 5:
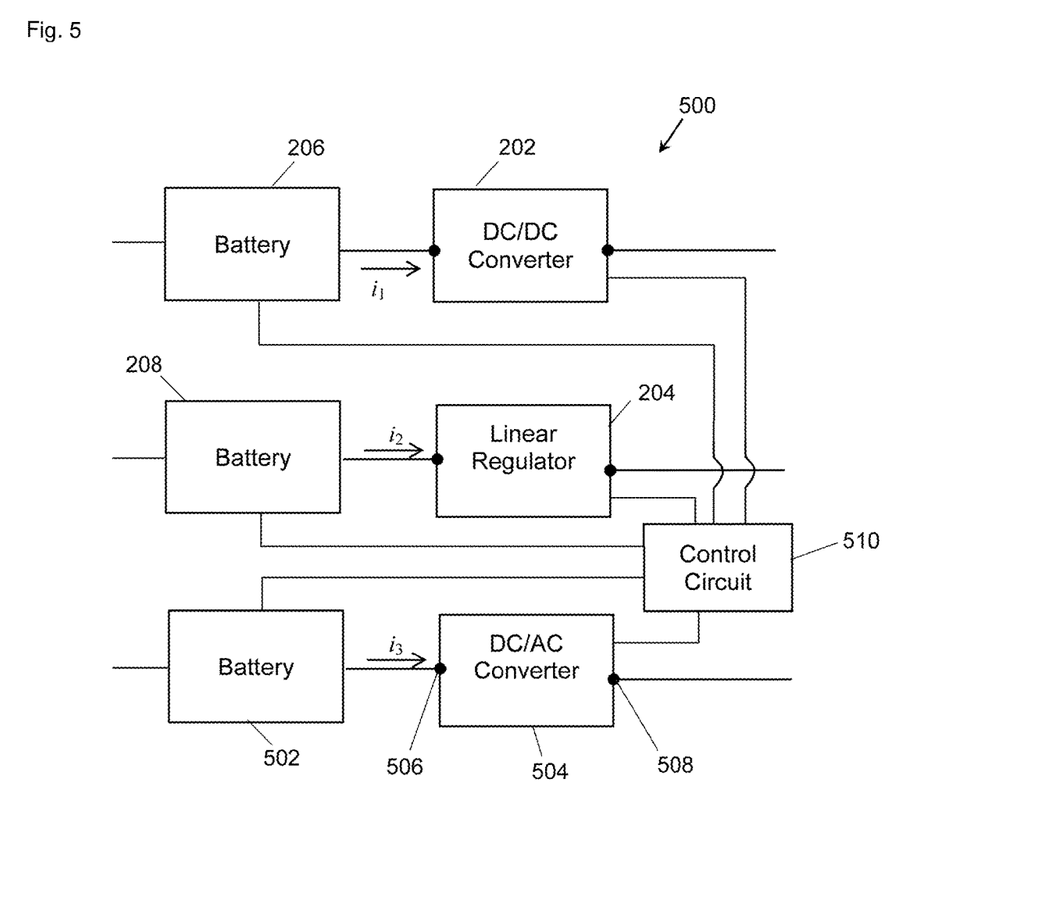
FIG. 5 is a block diagram of a system including three batteries, three converters, and a control circuit for controlling current drawn from the batteries according to another example embodiment.

Although FIGS. 2-4 illustrate two batteries and two converters, it should be understood that more than two batteries and/or two converters may be employed without departing from the scope of the disclosure. For example, FIG. 5 illustrates a system 500 including the batteries 206, 208 and the power converters 202, 204 of FIG. 2, a power converter 504 including an input terminal 506 and an output terminal 508, a battery 502 coupled to the input terminal 506, and a control circuit 510. Similar to the batteries 206, 208, the battery 502 has a time to EOD and supplies a current i3 to its respective converter 504.

The control circuit 510 of FIG. 5 is substantial similar to the control circuit 210 of FIG. 2. For example, and as shown in FIG. 5, the control circuit 510 is coupled to each converter 202, 204, 504 and determines a SOC and a ROD of each battery, calculates a time to EOD of each battery based on its SOC and ROD, etc.

The control circuit 510 may control one or more of the converters 202, 204, 504 as explained herein. For example, the control circuit 510 may control the converters 202, 204 to adjust the current i1, i2 drawn from the batteries 206, 208 to change a ROD of the time to EOD of each battery 206, 208 as explained herein. In some embodiments, the control circuit 510 may also control the converter 504 to adjust the current i3 drawn from the battery 502 to change a ROD of the time to EOD of the battery 502.

In other embodiments, and as explained above, the current i3 may be adjusted without specifically controlling the converter's 504 input current if the outputs of the converters 202, 204, 504 are coupled in parallel. In such examples, adjusting output currents (and therefore input currents) of converters 202, 204 may adjust an output current (and therefore an input current) of the converter 504 assuming a constant load demand and output voltage regulation. As such, the control circuit 510 (as well as any other control circuit disclosed herein) may control N−1 converters in its system where N equals the number of converters.

In the particular example shown in FIG. 5, the power converter 202 includes a DC/DC converter, the power converter 204 includes a linear regulator, and the power converter 504 includes a DC/AC converter (e.g., commonly referred to as an inverter). Alternatively, the power converters 202, 204, 504 may include another suitable circuit capable of adjusting its input current as explained above. Further, although the converters 202, 204, 504 of FIG. 5 are shown as including different types of converters, it should be understood that two or more of the converters 202, 204, 504 may include the same type of converter (e.g., a DC/DC converter, a DC/AC converter, etc.) if desired.

Figure 6:
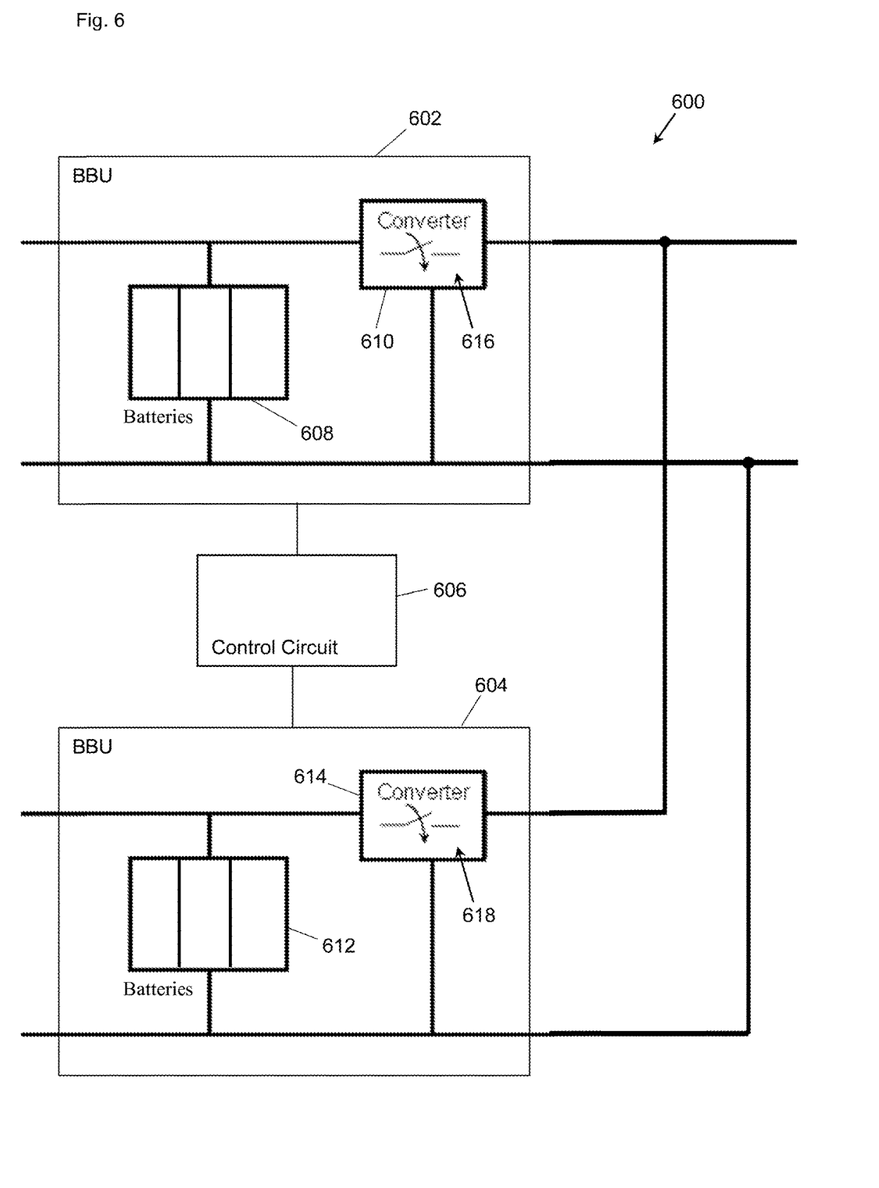
FIG. 6 is a block diagram of a system including two battery backup units (BBUs) each having batteries and a converter, and a shared control circuit for controlling current drawn from the batteries according to yet another example embodiment.

In some examples, the batteries and the converters disclosed herein may be components of a battery backup unit (BBU). For example, FIG. 6 illustrates a power system 600 including two BBUs 602, 604 and an external control circuit 606 coupled to each BBU 602, 604. Each BBU 602, 604 includes three batteries 608, 612 and a power converter 610, 614 coupled to the output of the batteries 608, 612. As shown in FIG. 6, each converter 610, 614 may include at least one power switch 616, 618. The converter 610, 614 may include one or more DC/DC converters, DC/AC inverters, and/or other suitable converters as explained herein.

Each BBU 602, 604 provides backup power to a load (not shown) in the event a primary power source (not shown) is unable to do so as explained above. Additionally, the batteries 608, 612 may be, for example, recharged by the primary power source and/or another power source.

The control circuit 606 of FIG. 6 is substantially similar to the control circuit 210 of FIG. 2. As such, the control circuit 606 may monitor the times to EOD of the batteries 608, 612, and in response to the times to EOD of the batteries 608, 612 not being substantially equal, control at least one of the converters 610, 614 to adjust the current drawn from its corresponding batteries to change a rate of decrease of the time to EOD of those batteries.

For example, the control circuit 606 may regulate one or both of the converter's 610, 614 output voltage to one or more altered voltage setpoints causing the amount of current drawn from the batteries 608, 612 to adjust as explained above. This may be accomplished, for example, by controlling a duty cycle of a control signal provided to the power switches 616, 618. In some embodiments, the control circuit 606 may control the power switches 616, 618 by pulse width modulation (PWM), pulse frequency modulation (PFM), and/or another suitable control method.

Figure 7:
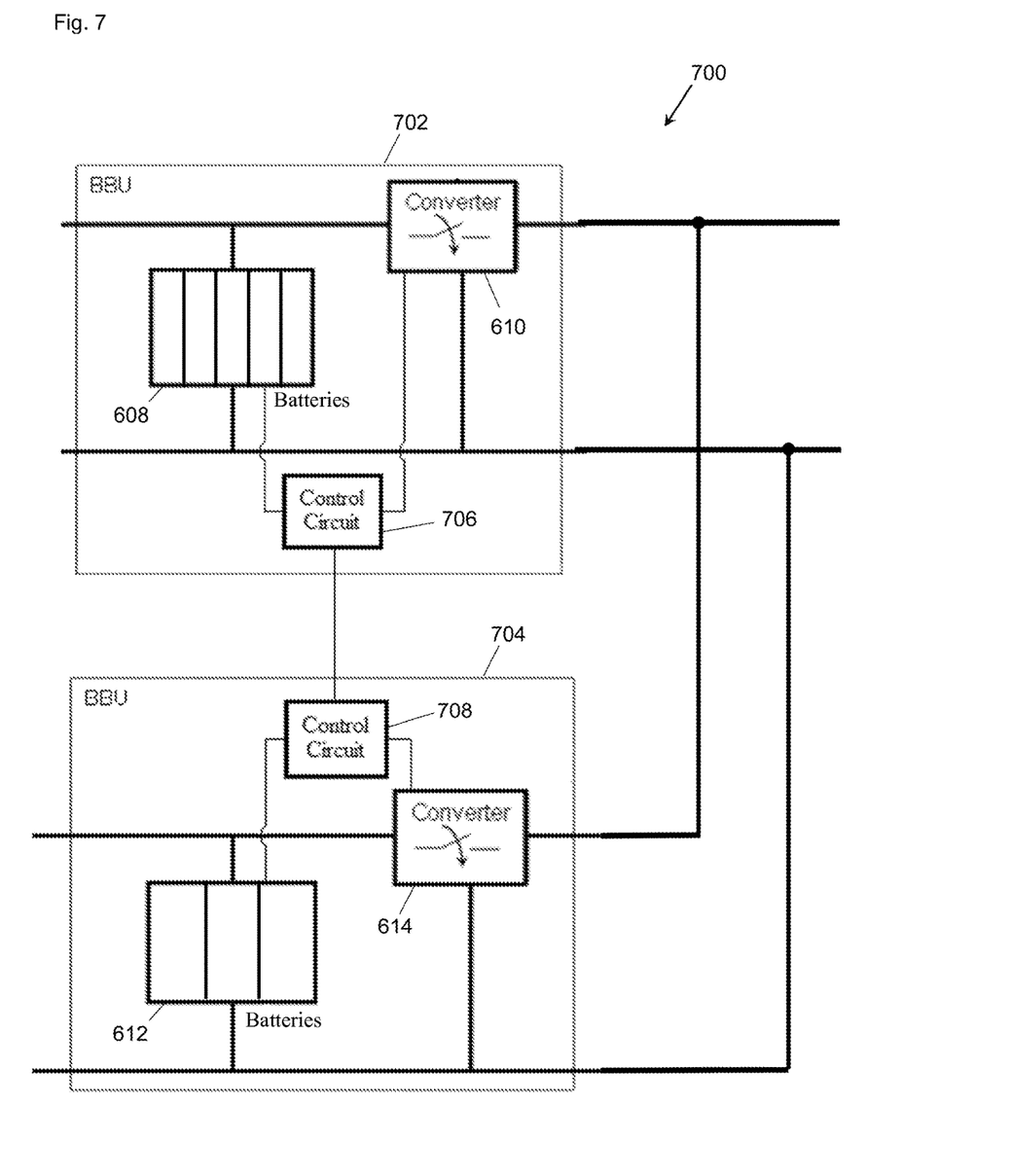
FIG. 7 is a block diagram of a system including two BBUs each having batteries, a converter, and a control circuit communicating with the other BBU's control circuit according to yet another example embodiment.

In some examples, a control circuit may be positioned in one or more of the BBUs (e.g., an internal control circuit). For example, FIG. 7 illustrates another system 700 including two BBUs 702, 704 substantially similar to the BBUs 602, 604 of FIG. 6. The BBU 702, however, includes five batteries 608 and its own control circuit 706 and the BBU 704 includes three batteries 612 and its own control circuit 708 in communication with the control circuit 706. For example, the control circuit 706 may communicate the time to EOD of the batteries 608 to the control circuit 708, or it may communicate one or more sensed parameters of the batteries 608 to allow the control circuit 708 to determine the time to EOD of the batteries 608, etc.

Figure 8:
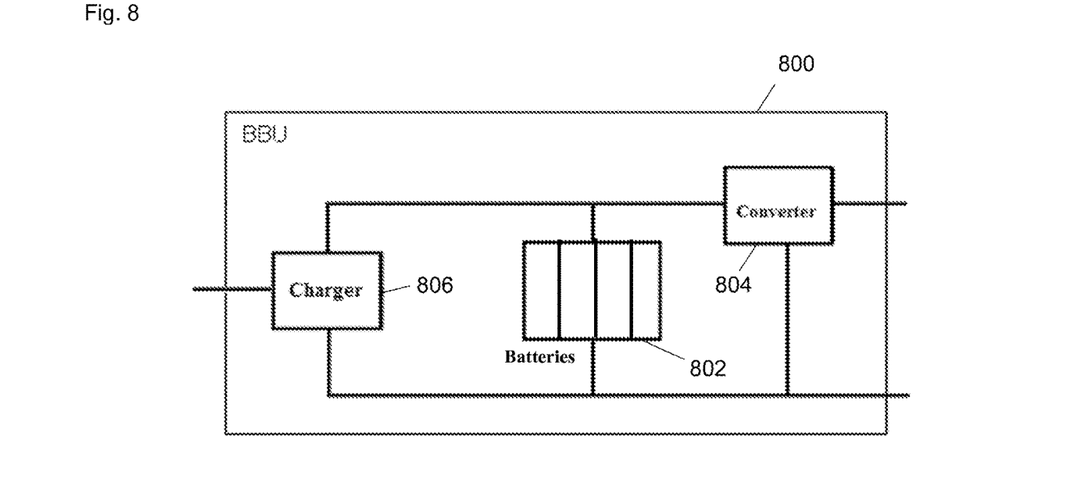
FIG. 8 is an example BBU that may be used in the systems of FIGS. 6 and 7.

Although FIGS. 6 and 7 illustrate a particular BBU configuration, it should be understood that other suitable BBU configurations may be employed without departing from the scope of the present disclosure. For example, FIG. 8 illustrates another BBU 800 employable in the systems 600 and 700. The BBU 800 includes five batteries 802, a converter 804 coupled to an output of the batteries 802, and a charger 806 coupled to an input of the batteries 802. The batteries 802 and/or the converter 804 may be substantially similar to the batteries 608, 612 and the converters 610, 614 of FIG. 6.

As shown in FIG. 8, the batteries 802 are recharged by the charger 806. The charger 806 may include, for example, one or more rectifiers, converters, etc. for providing power to the batteries 802. As such, an input of the charger 806 may be coupled to a DC source or an AC source.

Figure 9:
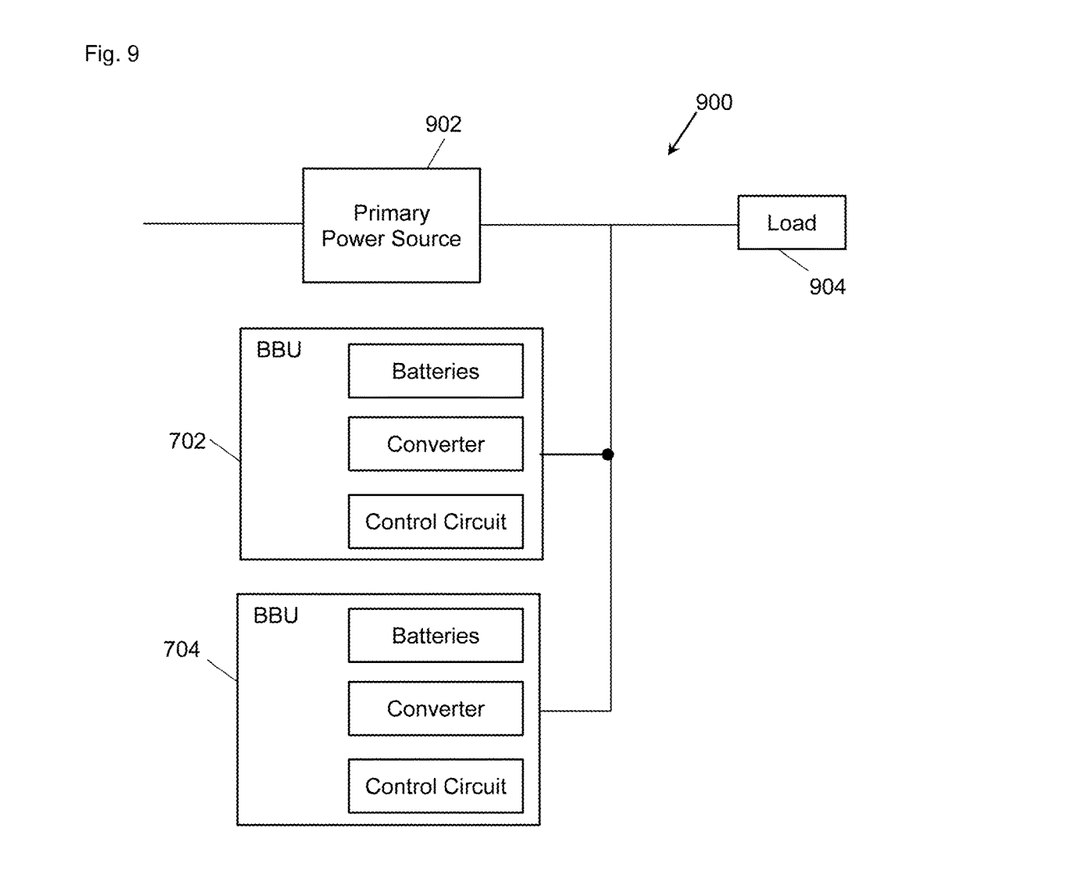
FIG. 9 is a block diagram of a system including a primary power source and two BBUs providing backup power to a load according to another example embodiment.

FIG. 9 illustrates a system 900 including a primary power source 902 and the BBUs 702, 704 of FIG. 7, all of which are coupled to a load 904. The primary power source 902 provides power to the load 904. In the event the primary power source 902 is unable to do so, the BBUs 702, 704 are able to sustain the load 904 for a period of time as explained herein. The primary power source 902 may include one or more power converters such as rectifiers, DC/DC converters and/or other suitable power sources.

Although the system 900 of FIG. 9 includes the BBUs 702, 704 of FIG. 7, it should be understood that other suitable BBUs (e.g., the BBU 602, 604, 800, etc.) may be employed without departing from the scope of this present disclosure.

The power converters disclosed herein may be any suitable converter. For example, and as shown in FIG. 5, the power converters may include a DC/DC converter, a DC/AC inverter, a linear regulator, etc. Additionally, two or more power converters of a power system may have the same or a different type of converter (e.g., DC/DC converter, a DC/AC inverter, etc.). In some embodiments, the power converters may be a component in a switched-mode power supply (SMPS).

The power converters disclosed herein may include, for example, a buck converter, a boost converter, a buck/boost converter, etc. having at least one power switch. Alternatively, the power converters disclosed herein may include another suitable circuit capable of adjusting its input current as explained above.

The control circuits disclosed herein may include an analog control circuit, a digital control circuit (e.g., a digital signal processor (DSP), a microprocessor, a microcontroller, etc.), or a hybrid control circuit (e.g., a digital control circuit and an analog control circuit). Thus, the methods disclosed herein may be performed by a digital control circuit. Additionally, the entire control circuit, some of the control circuit, or none of the control circuit may be an integrated circuit (IC).

In some examples, the control circuits may be incorporated into a system control circuit (e.g., a system control card (SCC), etc.) of a particular system. Alternatively, each converter, two or more converters, etc. may be controlled by a dedicated control circuit separate from a primary power source control circuit if desired.

Additionally, although FIGS. 2-5 illustrate a particular number of batteries, power converters, and/or control circuits and FIGS. 6, 7 and 9 illustrate a particular number of BBUs, it should apparent that the power systems disclosed herein may include two or more batteries, power converters, BBUs, etc. and/or one or more control circuits.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A power system comprising:
a first power converter and a second power converter;
a first battery having a time to end of discharge (EOD) and coupled to output a current to the first power converter;
a second battery having a time to EOD and coupled to output a current to the second power converter; and
a control circuit coupled to the first power converter and the second power converter, the control circuit configured to monitor the time to EOD of the first battery and the time to EOD of the second battery, and in response to the time to EOD of the first battery and the time to EOD of the second battery not being substantially equal, control the first power converter to adjust the current drawn from the first battery to change a rate of decrease of the time to EOD of the first battery.

2. The power system of claim 1 wherein the time to EOD of the first battery is a state of charge (SOC) of the first battery divided by a rate of discharge (ROD) of the first battery and wherein the time to EOD of the second battery is a SOC of the second battery divided by a ROD of the second battery.

3. The power system of claim 1 wherein the control circuit is configured to control the first power converter to adjust the current drawn from the first battery to a maximum current of the first battery.

4. The power system of claim 1 wherein the control circuit is configured to control the second power converter to adjust the current drawn from the second battery.

5. The power system of claim 1 wherein the control circuit is configured to control at least one of the first power converter and the second power converter so that the current drawn from the first battery is substantially equal to the current drawn from the second battery in response to the time to EOD of the first battery and the time to EOD of the second battery being substantially equal.

6. The power system of claim 1 wherein the control circuit is configured to control the first power converter to adjust the current drawn from the first battery until the time to EOD of the first battery is substantially equal to the time to EOD of the second battery.

7. The power system of claim 1 wherein the first power converter and the first battery are components of a battery backup unit.

8. The power system of claim 7 wherein the battery backup unit is a first battery backup unit, wherein the control circuit includes a first control circuit positioned in the first battery backup unit and a second control circuit in communication with the first control circuit, and wherein the second power converter, the second battery, and the second control circuit are components of a second battery backup unit.

9. The power system of claim 1 wherein the control circuit includes a digital control circuit.

10. The power system of claim 1 wherein the control circuit is configured to monitor the time to EOD of the first battery and the time to EOD of the second battery by monitoring one or more parameters of the first battery and monitoring one or more parameters of the second battery, respectively.

11. The power system of claim 10 wherein the one or more parameters of the first battery include at least one of the current drawn from the first battery, a voltage of the first battery, an age of the first battery, and a number of charge cycles of the first battery and wherein the one or more parameters of the second battery include at least the current drawn from the second battery, a voltage of the second battery, an age of the second battery, and a number of charge cycles of the second battery.

12. The power system of claim 1 wherein the first power converter includes a DC/DC converter.

13. The power system of claim 12 wherein the DC/DC converter includes at least one power switch and wherein the control circuit is configured to control the at least one power switch by at least one of pulse width modulation (PWM) and pulse frequency modulation (PFM).

14. The power system of claim 1 wherein outputs of the first power converter and the second power converter are coupled in parallel.

15. The power system of claim 1 wherein each of the first power converter and the second power converter includes an input terminal and an output terminal, wherein the output terminal of the first power converter is coupled to a first load, and wherein the output terminal of the second power converter is coupled to a second load different than the first load.

16. The power system of claim 1 further comprising a third power converter, a third battery having a time to EOD and coupled to output a current to the third power converter, and wherein the control circuit is coupled to the third power converter and configured to monitor the time to EOD of the third battery.

17. The power system of claim 16 wherein the control circuit is configured to control at least one of the second power converter to adjust the current drawn from the second battery to change a rate of decrease of the time to EOD of the second battery and the third power converter to adjust the current drawn from the third battery to change a rate of decrease of the time to EOD of the third battery.

18. A method for substantially matching a time to EOD of a plurality of batteries, the method comprising:
  determining a time to EOD of a first battery of the plurality of batteries coupled to provide a current to a first power converter;
  determining a time of EOD of a second battery of the plurality of batteries coupled to provide a current to a second power converter; and
  in response to the time to EOD of the first battery and the time to EOD of the second battery not being substantially equal, controlling the first power converter to adjust the current drawn from the first battery to change a rate of decrease of the time to EOD of the first battery.

19. The method of claim 18 wherein controlling the first power converter includes controlling the first power converter to adjust the current drawn from the first battery to change a rate of decrease of the time to EOD of the first battery until the time to EOD of the first battery is substantially equal to the time to EOD of the second battery.

20. The method of claim 18 further comprising controlling at least one of the first power converter and the second power converter so that the current drawn from the first battery is substantially equal to the current drawn from the second battery in response to the time to EOD of the first battery and the time to EOD of the second battery being substantially equal.

* * * * *